United States Patent
Karam

(10) Patent No.: US 7,797,614 B2
(45) Date of Patent: *Sep. 14, 2010

(54) NON-REDUNDANT MULTI-ERROR CORRECTING BINARY DIFFERENTIAL DEMODULATOR

(75) Inventor: Mostafa A. Karam, Moorpak, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 1002 days.

This patent is subject to a terminal disclaimer.

(21) Appl. No.: 11/582,260

(22) Filed: Oct. 17, 2006

(65) Prior Publication Data

US 2008/0092022 A1    Apr. 17, 2008

(51) Int. Cl.
*H03M 13/00* (2006.01)

(52) U.S. Cl. .................. 714/785; 375/336; 714/774

(58) Field of Classification Search ........... 714/793, 714/774, 785; 375/336
See application file for complete search history.

(56) References Cited

U.S. PATENT DOCUMENTS

| | | | |
|---|---|---|---|
| 3,529,290 A | | 9/1970 | Schroeder et al. |
| 4,128,828 A | | 12/1978 | Samejima et al. |
| 4,660,196 A | * | 4/1987 | Gray et al. ............ 370/326 |
| 6,223,322 B1 | * | 4/2001 | Michigami et al. ...... 714/769 |
| 6,356,555 B1 | * | 3/2002 | Rakib et al. ............ 370/441 |
| 6,466,564 B1 | * | 10/2002 | Rakib et al. ............ 370/342 |
| 6,718,506 B1 | * | 4/2004 | Sebastian et al. ........ 714/763 |
| 6,728,925 B2 | * | 4/2004 | Ishiwatari et al. ........ 714/777 |
| 7,593,487 B2 | * | 9/2009 | Karam ................... 375/336 |
| 2005/0229081 A1 | * | 10/2005 | Lin et al. ............... 714/769 |

OTHER PUBLICATIONS

Masamura, T., et al. "Differential detection of MSK with nonredundant error correction". *IEEE Transactions on Communications*. vol. COM-27. pp. 912-918. (1979).
Samejima, S., et al. "Differential PSK system with nonredundant error correction". *IEEE Journal on Selected Areas in Communications*. vol. SAC-1. pp. 74-81. (1983).
Barbounakis, I., et al. "Duoquaternary FSK receivers in mobile communications". *IEEE*. vol. VTC01. pp. 1987-1991. (2001).
Masamura, T. "Intersymbol interference reduction for differential MSK by nonredundant error correction". *IEEE Transaction On Vehicular Technology*. vol. 39. pp. 27-36. (1990).

* cited by examiner

*Primary Examiner*—M. Mujtaba K Chaudry

(57) ABSTRACT

An algorithm for a non-redundant multi-error correcting binary differential demodulator simplifies error detection and reduces memory requirements in circuits embodying the same. The demodulator includes a differential detectors (DD) module, an error signal generator (ESG) module, and an error detection-and-correction (EDAC) module. The DD module receives modulated binary input at each of (k+1) differential detectors, each producing (k+1) outputs. The ESG module combines the $(k+1)^2$ output signals with k corrected feedback signals to derive syndromes orthogonal to an erroneous bit to be corrected and generates 2k error signals from the syndromes. The EDAC module generates a correction factor from the 2k error signals and combines the factor with the output of the first order detector delayed by k bits to correct an erroneous bit. The k corrected feedback signals may be derived by successively delaying the corrected erroneous bit. Simplified higher order demodulators may be constructed using a nested hierarchy of lower order demodulators based on the algorithm.

20 Claims, 15 Drawing Sheets

FIG. 1 (PRIOR ART)

Common Features of Existing NEC Binary Demodulators

| Number of Consecutive Errors to Be Corrected | Number of Required Differential Detectors | Erroneous Bit to Be Corrected at Instant $i$ | Number of Bits Left Without Correction |
|---|---|---|---|
| $k$ | $k+1$ | $i-k$ | $k$ |
| 1 | 2 | $i-1$ | 1 |
| 2 | 3 | $i-2$ | 2 |

FIG. 2 (PRIOR ART)

Requirements of Binary Differential Demodulators Based on Existing Non-Redundant Error Correcting Algorithms

| Number of Consecutive Errors to Be Corrected | Number of Syndromes | Number of Searched Error Patterns | Number of Stored Error Patterns | Length of Required Memory (Chips) |
|---|---|---|---|---|
| 1 | 2 | 4 | 1 | 2 |
| 2 | 6 | 64 | 9 | 54 |
| 3 | 12 | 4096 | 121 | 1452 |
| 4 | 20 | 1048576 | 2325 | 46500 |
| 5 | 30 | 1.0737E+9 | 59536 | 1786080 |

| Requirements of Binary Differential Demodulators Based on the Present Invention ||||||
| --- | --- | --- | --- | --- | --- |
| Number of Consecutive Errors to Be Corrected | Number of Error Signals | Error Correcting Threshold Should Be Greater Than | Number of Searched Error Patterns | Number of Stored Error Patterns | Length of Required Memory (Chips) |
| $k$ | $2k$ | $k$ | 0 | 0 | 0 |
| 1 | 2 | 1 | 0 | 0 | 0 |
| 2 | 4 | 2 | 0 | 0 | 0 |
| 3 | 6 | 3 | 0 | 0 | 0 |
| 4 | 8 | 4 | 0 | 0 | 0 |
| 5 | 10 | 5 | 0 | 0 | 0 |

FIG. 5

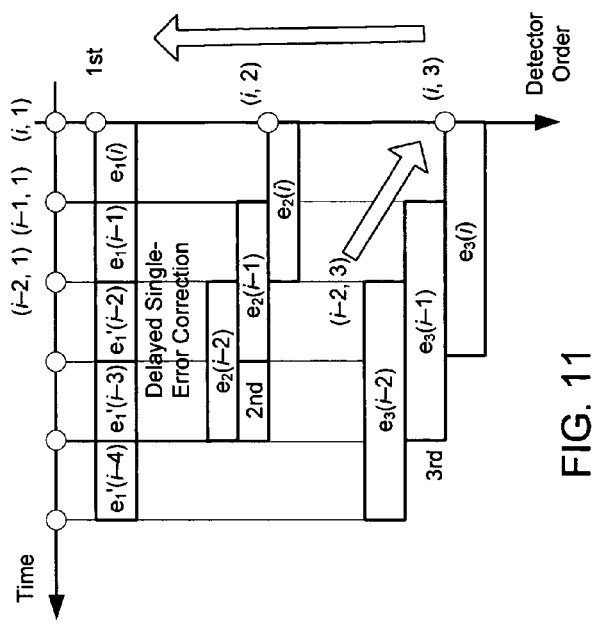
FIG. 11
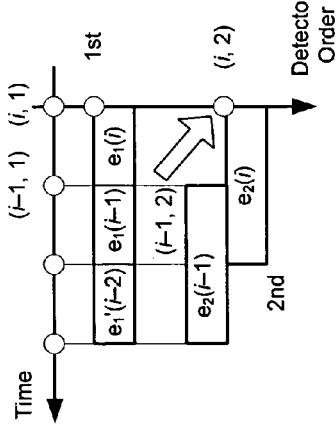
FIG. 9
| Errors with a Value 1 | Number of Error Signals Having a 0 Value | Algebraic Sum of Error Signals (eq. 17) |
|---|---|---|
| $e_1(i-1)$ only | 0 | 2 |
| $e_1(i-1)$ and one additional error | 1 | 1 |
FIG. 10

| Errors with a Value 1 | Number of Error Signals Having a 0 Value | Algebraic Sum of Error Signals (eq. 20) |
|---|---|---|
| $e_1(i-2)$ only | 0 | 4 |
| $e_1(i-2)$ and one additional error | 1 | 3 |

FIG. 12

| Errors with a Value 1 | Number of Error Signals Having a 0 Value | Algebraic Sum of Error Signals (eq. 23) |
|---|---|---|
| $e_1(i-3)$ only | 0 | 6 |
| $e_1(i-3)$ and one additional error | 1 | 5 |
| $e_1(i-3)$ and two additional errors | 2 | 4 |

FIG. 14

| Errors with a Value 1 | Number of Error Signals Having a 0 Value | Algebraic Sum of Error Signals (eq. 26) |
|---|---|---|
| $e_1(i-4)$ only | 0 | 8 |
| $e_1(i-4)$ and one additional error | 1 | 7 |
| $e_1(i-4)$ and two additional errors | 2 | 6 |
| $e_1(i-4)$ and three additional errors | 3 | 5 |

FIG. 16

| Errors with a Value 1 | Number of Error Signals Having a 0 Value | Algebraic Sum of Error Signals (eq. 29) |
|---|---|---|
| $e_1(i-5)$ only | 0 | 10 |
| $e_1(i-5)$ and one additional error | 1 | 9 |
| $e_1(i-5)$ and two additional errors | 2 | 8 |
| $e_1(i-5)$ and three additional errors | 3 | 7 |
| $e_1(i-5)$ and four additional errors | 4 | 6 |

FIG. 18

NON-REDUNDANT MULTI-ERROR CORRECTING BINARY DIFFERENTIAL DEMODULATOR

BACKGROUND OF THE INVENTION

1. Field of the Invention

The present invention relates to binary differential demodulators. More specifically, the invention relates to non-redundant multi-error correcting differential demodulators for binary digital frequency or digital phase modulated signals.

2. Description of Related Art

Differential demodulators have been widely used in varieties of communication systems that use either digital frequency or digital phase modulated signals. Among those systems are IFF communication systems, underwater communication systems, mobile communication systems, satellite communication systems, etc. Differential demodulators require simpler circuits and they do not require carrier recovery. However, their bit error rate BER performance is inferior to that for the corresponding coherent demodulators. Coherent demodulators usually require carrier recovery and hence more complex circuits.

Non-redundant error correcting (NEC) techniques have been deployed to improve bit error rate performance of differential demodulators, similarly to conventional error correcting codes, but without the requirement for extra redundant bits, and extra bandwidth or power. See, e.g., U.S. Pat. Nos. 3,529,290 and 4,128,828. NEC techniques use outputs of several order (bits) differential detectors along with the outputs of a first order (conventional) differential detector in detecting and correcting erroneous data bits. Outputs of the first order detector have been used to recover modulated data and outputs of higher order detectors have been used as a parity check for the recovered data. NEC techniques offer varieties of error correcting capabilities, such as single-error correcting capability, double-error correcting capability, and triple-error correcting capability. As the order of error-correcting capability increases, the order of deployed differential detectors, and hence the demodulator complexity increase.

Techniques for single-error correcting capability have been proposed by T. Masamura, et al., "Differential Detection of MSK with Nonredundant Error Correction," IEEE Trans. Communications, COM-27, June 1979; by S. Samejima et al., "Differential PSK System with Non-Redundant Error Correction," IEEE Journal on Selected Areas in Comm., pp. 74-81, 1983; and by I. S. Barbounakis et al., "Duoquaternary FSK Receivers in Mobile Communications," IEEE, VTC01, pp. 1987-1991, 2001. Techniques for double-error correcting capability have been proposed by T. Masamura, "Intersymbol Interference Reduction for Differential MSK by Nonredundant Error Correction," IEEE Trans. On Vehicular Technology, Vol. 39, No. 1, pp. 27-36, February 1990, by Y. Ha et al., "DMSK System with Nonredundant Error Correction Capability," IEEE GLOBECOM '91, pp. 770-774, 1991; and by I. S. Barbounakis et al., "Tamed Frequency Modulation Detection Analysis With NEC Receivers," IEE Proc. Comm., Vol. 147, No. 4, pp. 149-154, 2000. Techniques for triple error correcting capability have been proposed by J. Yang, et al., "An Improved π/4—QPSK With Nonredundant Error Correction for Satellite Mobile Broadcasting," IEEE Trans. On Broadcasting, Vol. 37, No. 1, pp. 9-16, 1991; and by D. P. C. Wong et al., "Nonredundant Error Correction Analysis and Evaluation of Differentially Detected π/4—shift DQPSK Systems in a Combined CCI and AWGN Environment," IEEE Trans. on Vehicular Technology, Vol. 41, No. 1, pp. 35-48, 1992.

In the open literature cited above, both non-redundant error correcting (NEC) binary, and multi-level (M-ary) differential demodulators have been designed. The designed NEC binary differential demodulators, which are addressed by the present invention, have only either a single-error or a double-error correcting capability. These demodulators have been used with modulation structures such as differential minimum shift keying (DMSK), binary phase shift keying (BPSK), and tamed frequency modulation (TFM).

The common features of existing NEC binary demodulators are depicted in the table of FIG. 1. Among those features are the number of differential detectors required to correct k (k=1,2,3) consecutive errors, the erroneous bit to be corrected at an instant i, and the number of bits left without correction at the end of any correction cycle.

Each of the existing NEC binary and multi-level demodulators cited above encompasses four modules: (i) a differential detectors module, (ii) a syndrome generator module, (ii) a syndrome register module, and (iii) a pattern detector module. The algorithms used in building and operating those modules are as follows. For a demodulator with k (k=1,2,3) consecutive error correcting capability, the differential detectors module encompasses (k+1) differential detectors, and it delivers the outputs of those detectors to the syndrome generator. The syndrome generator compares the outputs of the first order detector against the outputs of each higher order differential detector, leading to a set of k syndromes. The generated set of syndromes is delivered to the syndrome register, where it is combined with other k delayed syndrome sets associated with previous time intervals, thereby forming a syndrome matrix having k×(k+1) dimensions. The syndrome matrices are delivered to the pattern detector, where they are compared against specified stored error patterns to detect, and hence correct, any error that may be found.

The algorithms used in existing NEC binary demodulators impose requirements that limit the performance of those demodulators. Such requirements discouraged the design of future demodulators with higher order error correcting capabilities, e.g. triple-error correcting capability, quadruple-error correcting capability, etc. The following equations illustrate how such requirements discourage the design of future NEC demodulators. First, note equation (1) that gives the number of syndromes, ns, required for the operation of a k (k=1,2,3) order error correcting capability:

$$ns = k(k+1) \qquad (1)$$

This number of syndromes gives a number of error patterns, nep, that should be searched for specified stored error patterns:

$$nep = 2^{k(k+1)} \qquad (2)$$

The number of stored error patterns, nsp, is given by:

$$nsp = \sum_{i=0}^{k-1} \left( \frac{(k+1)^2 - 1}{i} \right) \qquad (3)$$

Each of the above stored patterns has a length of syndromes, ns. So multiplying equation (3) by equation (1) gives the memory required for storing the error patterns, memo, in bits, where:

$$\text{memo} = k(k+1)\left[\sum_{i=0}^{k-1}\left(\frac{(k+1)^2-1}{i}\right)\right] \quad (4)$$

Equations (1)-(4) are used in the table of FIG. 2 and in FIG. 3 to obtain the requirements of existing single-error, and double-error correcting binary demodulators. Equations (1)-(4) are also used in FIGS. 2 and 3 to project the requirements for the design of similar future NEC binary demodulators with higher order-error correcting capabilities, e.g. triple-error, quadruple-error, and quintuple-error correcting demodulators.

From FIGS. 2 and 3, it is clear that number of searched error patterns, and the number of stored error patterns, increase exponentially as the order of error-correcting capabilities increases. This makes pattern detection processes deployed within existing demodulators more time consuming, more memory demanding, and less accurate. These drawbacks have discouraged further design of NEC binary demodulators having higher order error correcting capabilities.

From FIGS. 2 and 3 it is also clear that the limitations of existing NEC binary demodulators reside within the syndrome register modules and the pattern detector modules used by those demodulators. The syndrome registers impose the following limitations:

a) The memory required to store the syndrome matrices increases quadratically with the increase of error correcting capabilities (eq. 1); and b) The use of delayed syndrome values by the syndrome registers makes the demodulators more vulnerable to error propagation.

As for pattern detectors, they impose the following limitations:

a) Pattern detectors require memories to store specified error patterns. Both the number of stored error patterns, and the length of required memory increase exponentially as the order of error correcting capabilities increases; and b) Pattern detector processes performed within any pattern detector consume time and they may be associated with uncertainties, especially at higher-order correcting capabilities.

What is needed is a demodulator having higher order error-correcting capabilities that does not suffer the foregoing limitations.

SUMMARY OF THE INVENTION

The present invention includes an algorithm for a non-redundant multi-error correcting binary differential demodulator that simplifies error detection and correction; and reduces memory requirements in circuits, software or methods embodying the algorithm. The demodulator includes a differential detectors (DD) module, an error signal generator (ESG) module, and an error detection-and-correction (EDAC) module. The DD module may contain a plurality of differential detectors. In one embodiment, the DD module receives a modulated input signal at each of (k+1) differential detectors, where k is an integer greater than zero. Each differential detector in the DD module produces an output, which may generate k counterparts by successive delay of k bits, thereby generating a total of $(k+1)^2$ DD module outputs. The ESG module derives syndromes from the differential detector outputs and from feedback of corrected signals, such that the syndromes are orthogonal to an erroneous bit to be corrected. In one embodiment, the ESG module derives the syndromes by combining the $(k+1)^2$ output signals with k corrected feedback signals. In another embodiment, the ESG module derives the syndromes using one or more outputs of a higher-order differential detector as a parity check for outputs of one or more lower-order differential detectors.

The ESG module generates a number of error signals from the syndromes for output to the EDAC module. The EDAC module generates correction factors from the error signals and combines the correction factors with the error signals to produce the corrected signals. In one embodiment, the EDAC module generates the correction factors by summing the error signals algebraically, comparing the sum to a threshold value, and if the sum exceeds the threshold value, setting a correction factor to a binary one, otherwise setting the correction factor to a binary zero. In another embodiment, the ESG module generates k corrected feedback signals, which may comprise successively delayed signals derived from a corrected erroneous bit. In other embodiments, simplified higher order demodulators may be constructed using a nested hierarchy of lower order demodulators based on the same algorithm.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. The invention will be better understood upon consideration of the specification and the accompanying drawings, in which like reference numerals designate like parts throughout the figures, and wherein:

FIG. 1 is a table listing common features of existing NEC binary demodulators, including the number of differential detectors required to correct k (k=1,2,3) consecutive errors, the erroneous bit to be corrected at the time instant i, and the number of bits left without correction at the end of any correction cycle.

FIG. 2 is a table listing requirements of binary differential demodulators based on existing non-redundant error correcting algorithms.

FIG. 5 is a table listing requirements of binary differential demodulators based on an error-correcting algorithm according to the present invention.

FIG. 9 is an expanded time-detectors diagram for a single-error correcting binary demodulator according to the invention.

FIG. 10 is a table listing error signals and their algebraic sum for a single-error correcting binary demodulator according to the invention.

FIG. 11 shows an expanded time-detectors diagram for a double-error correcting binary demodulator according to the invention.

FIG. 12 is a table listing error signals and their algebraic sum for a double-error correcting binary demodulator according to the invention.

FIG. 14 is a table listing error signals and their algebraic sum for a triple-error correcting binary demodulator according to the invention.

FIG. 16 is a table listing error signals and their algebraic sum for a quadruple-error correcting binary demodulator according to the invention.

FIG. 18 is a table listing error signals and their algebraic sum for a quintuple-error correcting binary demodulator according to the invention.

DETAILED DESCRIPTION

The present invention provides a robust algorithm for the design of non-redundant multi-error correcting binary differential demodulators. The objective of the present invention is twofold: (i) enhancing existing double-error correcting binary demodulators, and (ii) designing demodulators with higher order-error correcting capabilities. In achieving these objectives, the present invention provides a robust algorithm for designing multi-error correcting binary differential demodulators that have the following novel features:

(a) An ESG module that replaces both syndrome generators and syndrome registers used in existing demodulators. Advantageously, the ESG module does not use delayed syndrome values, which reduces demodulator vulnerability to error propagation.

(b) An EDAC module that replaces pattern detectors of existing demodulators. The EDAC module uses threshold values in detecting and correcting errors. This eliminates pattern detection processes, and the memory requirements, time requirements, and uncertainties associated with pattern detection.

(c) The ability to build higher-order error correcting demodulators in terms of a nested hierarchy of the lower-order correcting demodulators. This facilitates the design of demodulators, and ensures their higher order error correcting capabilities.

Throughout this disclosure, the terms "classical syndrome matrix", "classical syndromes", and "existing demodulators" refer to any of various demodulating algorithms or techniques proposed in the literature cited above in the background section. Also throughout this disclosure, the term "module" may refer to a part or portion of an algorithm according to the invention, a circuit embodying such a part or portion, or software code or method steps embodying such a part or portion of an algorithm.

Demodulators based on an algorithm according to the invention may possess the same features of existing demodulators as given in the table of FIG. 1. However, in a demodulator according to the invention, the following requirements are more relaxed as compared to the requirements of existing demodulators: (i) the number of consecutive errors to be corrected, (ii) the number of syndromes, (iii) the number of searched error patterns, (iv) the number of stored error patterns, and (v) the length of required memory. This advantage may be readily observed by comparing FIG. 2 to FIG. 5. FIG. 2 shows tabulated requirements for binary differential demodulators based on existing non-redundant error correcting algorithms, whereas FIG. 5 shows the same requirements for binary differential demodulators that are based on the present invention.

Figure 3:
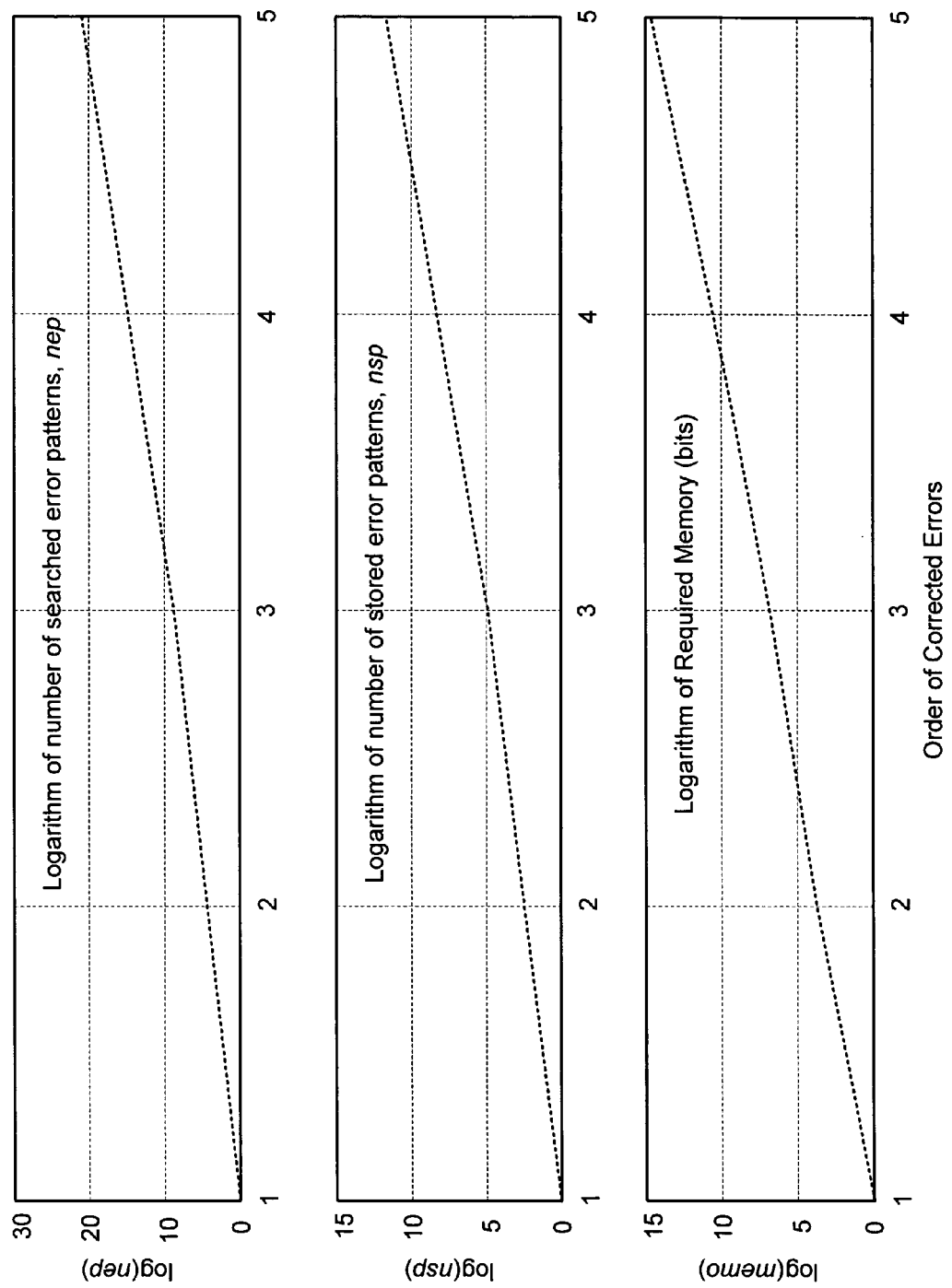
FIG. 3 shows requirements of binary differential demodulators based on existing non-redundant error correcting algorithms.
Figure 4:
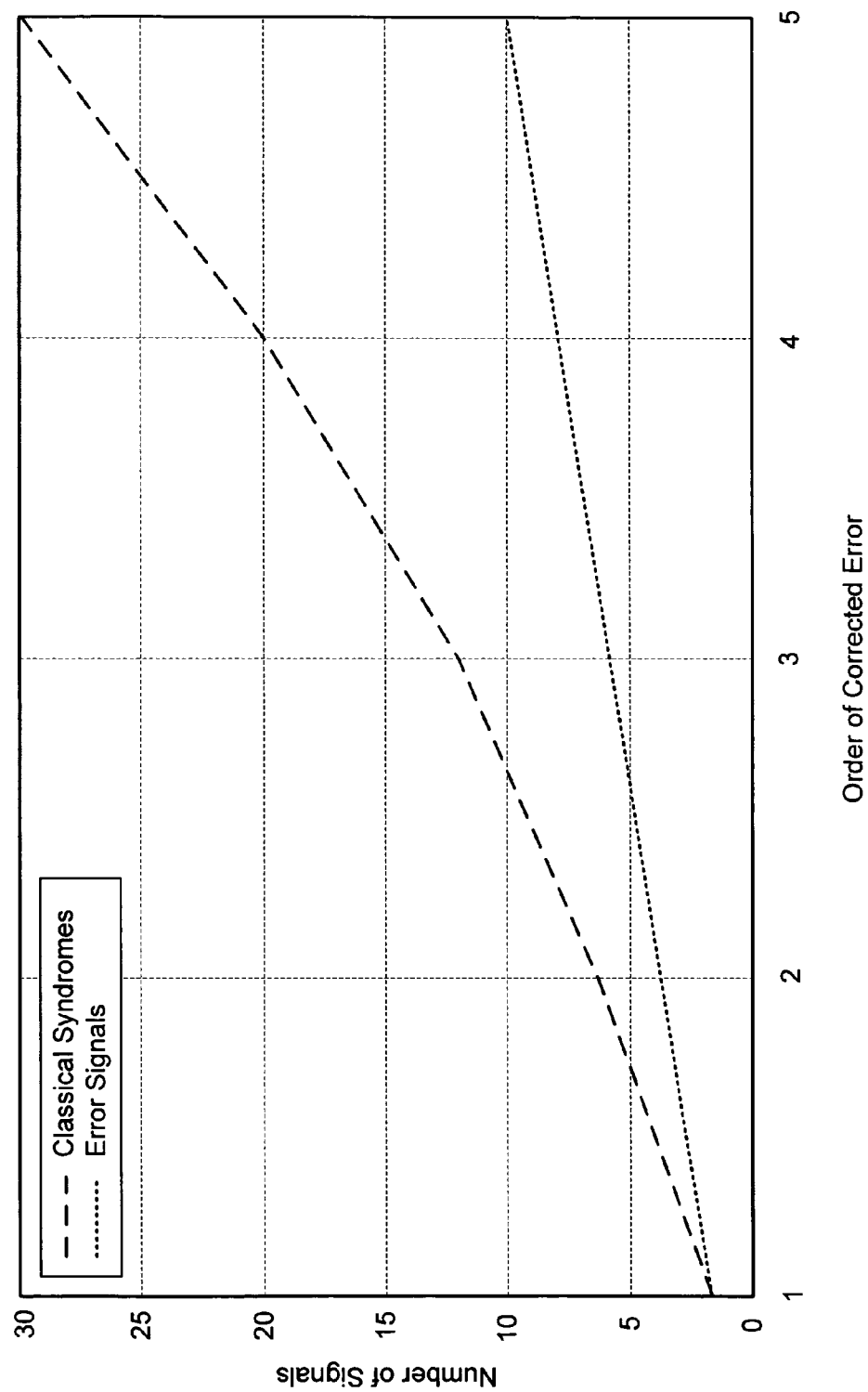
FIG. 4 is a graph showing, as a function of the order of corrected error, (i) the quadratic increase in size of a conventional syndrome matrix having an existing NEC binary demodulator, and (ii) the linear increase in the number of error signals in an embodiment according to the present invention.

The requirements of the present invention shown in FIG. 5 do not have any error patterns to be searched, or any error patterns to be stored. Thus, in a demodulator according to the invention (hereinafter "the present demodulator" or "the present algorithm"), the memory requirement in the rightmost column of FIG. 2 may be waived, and moreover, the pattern detection process may be eliminated from the demodulating algorithm. Also, the number of error signals of the present demodulator may increase linearly, whereas the size of a classical syndrome matrix within an existing NEC binary demodulator increases quadratically as the order of error correcting capabilities increases. This is depicted in FIG. 4, which shows both the size of a classical syndrome matrix, and the number of error signals of the present demodulator, calculated as a function of the order of corrected error.

Figure 6:
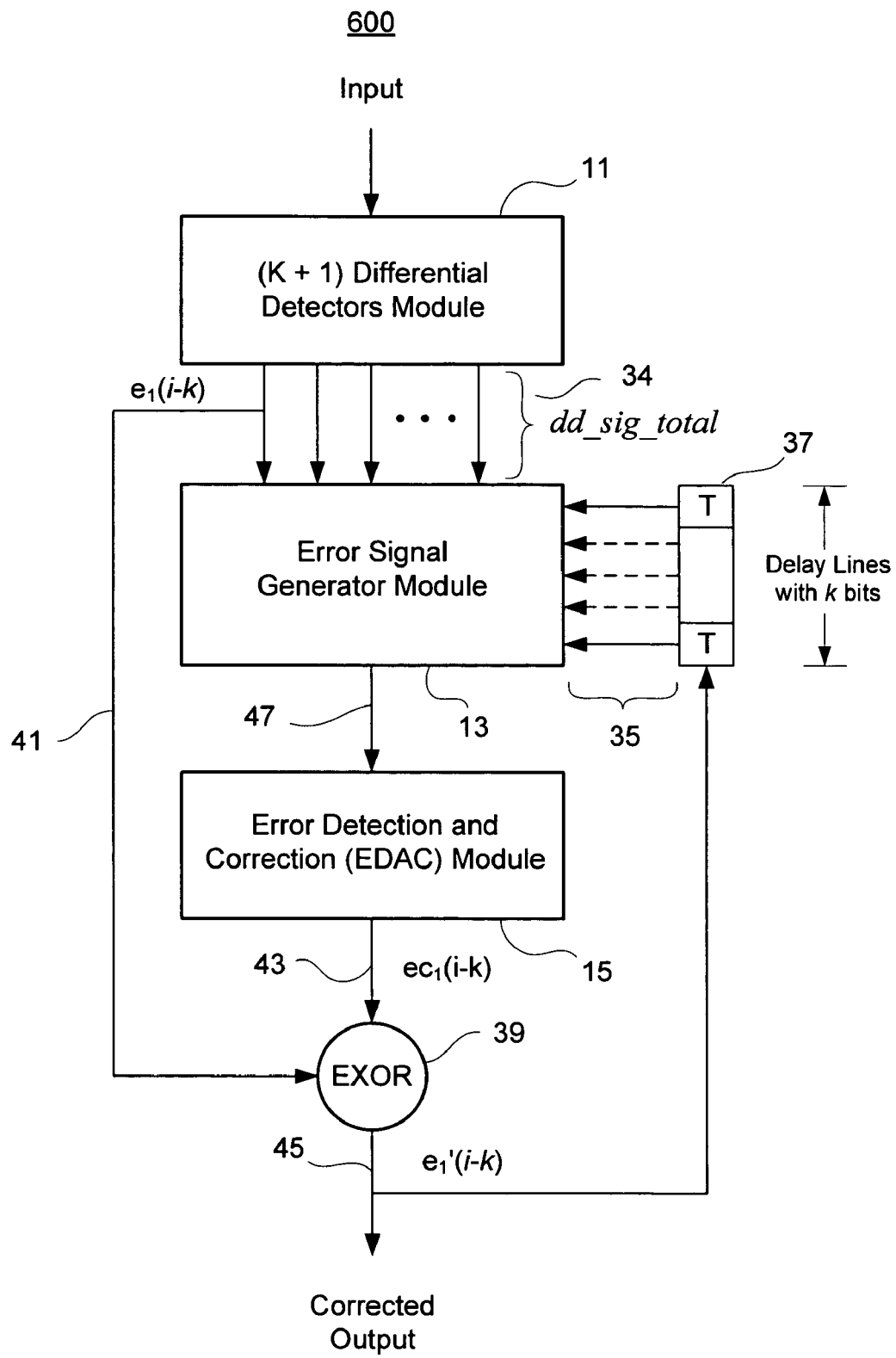
FIG. 6 is a block diagram showing a non-redundant binary demodulator with k order error correcting capability designed using an algorithm according to the invention.

The block diagram of FIG. 6 illustrates one embodiment 600 of the present demodulator. Demodulator 600 has a k-error correcting capability, and may include three modules: a differential detectors (DD) module 11; an error signal generator (ESG) module 13; and an error detection and correction (EDAC) module 15.

Differential Detectors Module

Figure 7:
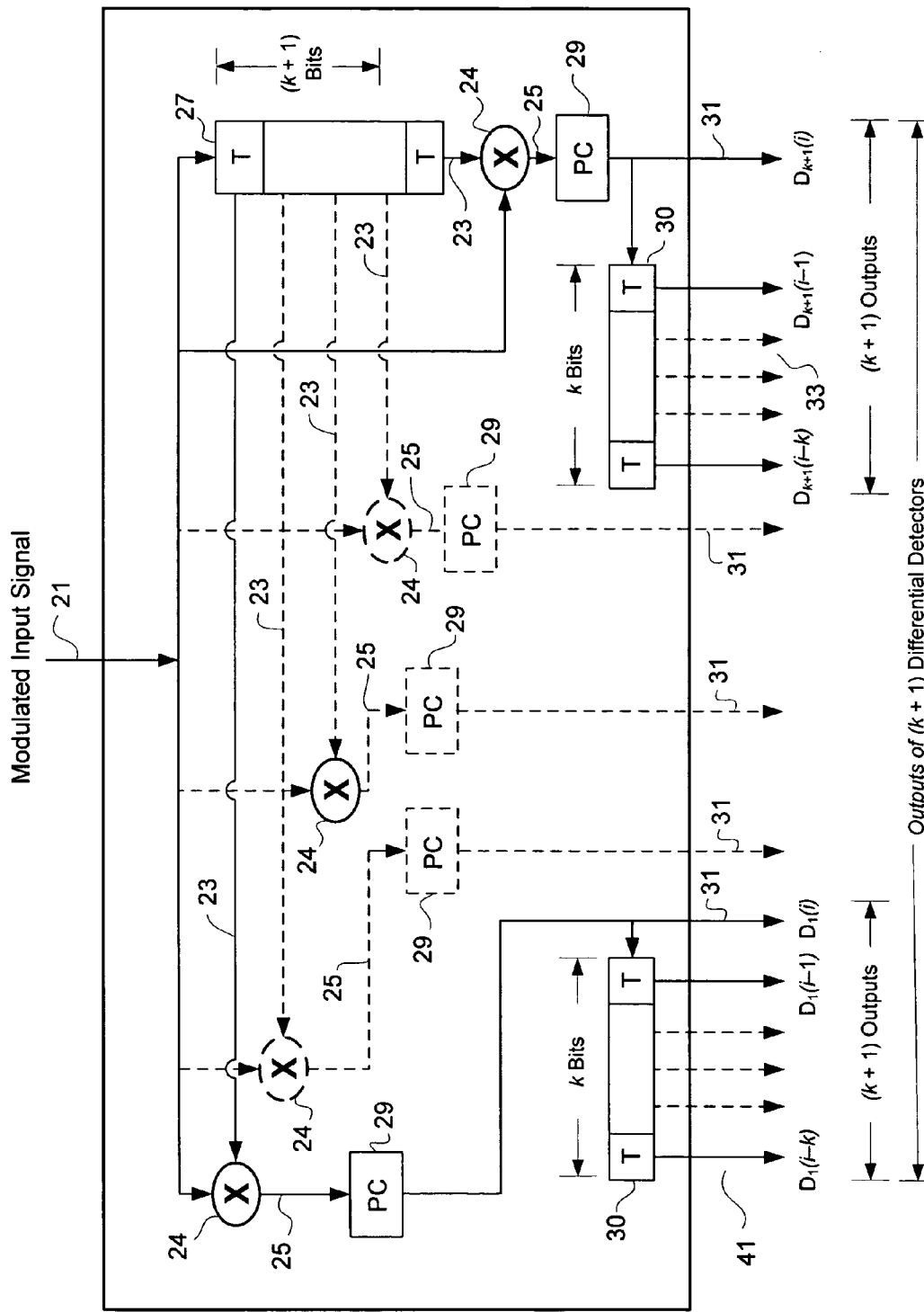
FIG. 7 is a block diagram of a differential detectors module according to the invention.

FIG. 7 illustrates one embodiment of a DD module 11. DD module 11 may encompass (k+1) differential detectors with orders ranging from 1 to (k+1). The outputs 25 of an arbitrary detector m (m=1, . . . , k+1) among those detectors may be obtained through mixing (or multiplying) by a mixer 24 a modulated input signal 21 with its counterpart 23 delayed by mT, where T is the duration of one bit, and where each delay may be effected by a delay module 27, as shown in the figure. After filtering out higher frequencies, the outputs 25 of the mixer may be passed through a phase comparator (PC) 29, which yields the detector outputs 31. An additional phase delay of π/2 may be added to the delayed signals, and an inverter (not shown) may follow the phase comparator 29 depending on the modulation type. For example, the additional phase delay and the inverter may be needed for differential detectors of odd orders for either differential minimum shift keying (DMSK) modulated signals or symmetric binary phase shift keying (SBPSK) modulated signals. In these two cases, the output of the $m^{th}$ detector at an arbitrary sampling time $t_i$ is given by:

$$D_m(i) = -\cos\left(m\frac{\pi}{2} + \Delta_m(i)\right) \quad (5)$$

$$\Delta_m(i) = \Phi(t_i) - \Phi(t_i - mT)$$

In case of conventional binary phase shift keying (CBPSK) modulated signals, the output of the $m^{th}$ detector may be given by:

$$D_m(i) = -\cos(\Delta_m(i)) \quad (6)$$

The quantity $\Phi(t_i)$ in equations (5)-(6) represents the phase of an input modulated signal at the sampling time $t_i$. The sampling time $t_i$ is usually taken at the end of each time interval, and $D_m(i)$ in either (5) or (6) may be used to represent "1" if it is greater than zero, and to represent "0" otherwise. After obtaining the outputs 31 of the differential detectors according to equations (5)-(6), outputs 31 may be delivered to ESG module 13, along with their counterparts 33 obtained through a successive delaying of k bits using delay modules 30. Since there are (k+1) detectors within DD module 11, the total number of signals dd_sig_total 34 delivered to ESG module 13 at an arbitrary sampling time $t_i$ may be given by:

$$dd\_sig\_total = (k+1)^2 \quad (7)$$

which accounts for each of the (k+1) outputs 31, plus k counterparts 33 generated for each of the (k+1) outputs 31. Among the outputs of the DD is output of the first order detector delayed by k bits, $e_1(i-k)$. This is the erroneous bit to be corrected 41, at the instant time i.

Error Signal Generator (ESG) Module

As shown in FIG. 6, ESG module 13 receives from DD module 11 the number of signals dd_sig_total 34 indicated by eq. (7). ESG module 13 may also receive other k successively delayed feedback corrected signals 35 from EDAC module 15, delayed by a delay module 37. Signals 35 may be corrected and delayed through an Exclusive OR (EXOR) operation, modeled in the figure as EXOR gate 39, which combines signals 41 (the erroneous bit to be corrected) and signals 43 (the output of EDAC module 15), into a corrected output 45. ESG module 13 may use both types of signals, i.e. differential detector outputs 34 and delayed feedback corrected signals 35, in generating a set of modified syndromes. The modified syndromes generate a set of error signals 47. The modified syndromes differ from the classical syndromes used in existing demodulators in four ways:

(i) The number of modified syndromes is less than the number of their classical syndrome counterparts. This overcomes the redundancy associated with classical syndromes.

(ii) The modified syndromes are not obtained by using outputs of higher-order differential detectors as a parity check for the outputs of first order differential detectors, as has been done to obtain classical syndromes. The modified syndromes are obtained by using outputs of a higher-order differential detector as a parity check for outputs of all other lower-order differential detectors, including outputs of the first order differential detector. Mathematically, this is equivalent to combining several classical syndromes through an EXOR gate (modulo 2 summation or subtraction). EXOR outputs a 0 when either each of its inputs is 0 or an even number of its inputs are similar, and outputs a 1 otherwise.

(iii) Unlike classical syndromes, the modified syndromes are orthogonal to the erroneous bit to be corrected, which means that such a bit appears in all modified syndromes. This facilitates error detection and correction processes.

(iv) Modified syndromes in case of a multi-error correcting demodulator are constructed through a nested hierarchy of their counterparts associated with lower-order correcting capabilities. This structure simplifies the design of higher order error correcting demodulators, and ensures their error correcting capabilities.

Figure 8:
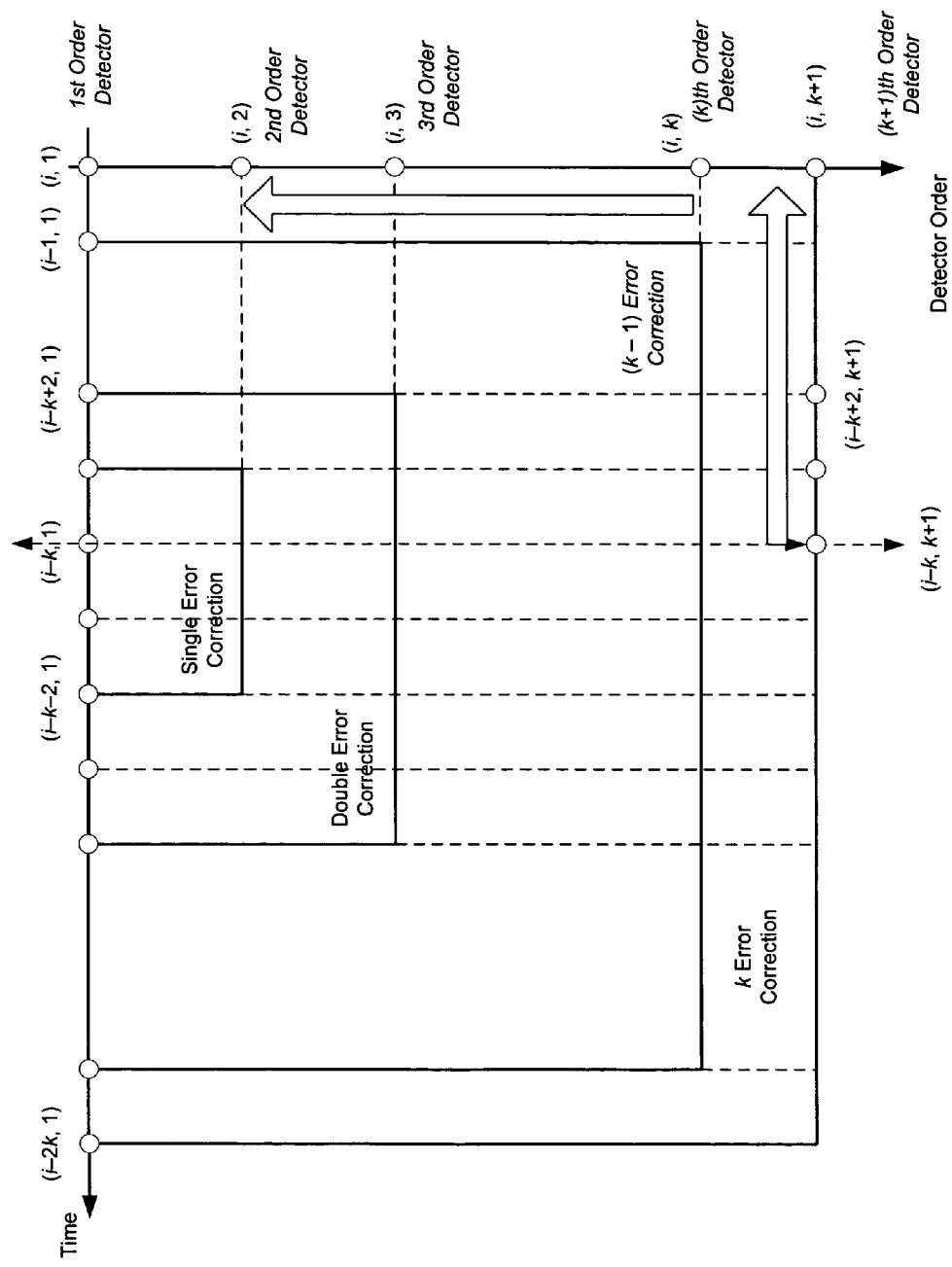
FIG. 8 is a time-detectors diagram for a demodulator with a k error correcting capability according to the present invention.

An example of the aforementioned nested hierarchy is shown in the time-detectors diagram of FIG. 8. The time-detectors diagram is instructive in constructing modified syndromes of an arbitrary k-error correcting demodulator according to the invention. The time-detectors diagram has two axes: a horizontal axis standing for the sampling time, and a downward vertical axis standing for the order of differential detectors. A node (i, m) within the time-detectors diagram stands for the output of a detector with order m at the sampling time $t_i$. The node (i−k, 1) gives the bit to be corrected. Moreover, nodes located on and to the right of a vertical line passing through the node (i−k, 1) are the nodes to be used in constructing the modified syndromes. Nodes used in constructing modified syndromes of a lower order error correcting demodulator are enclosed by a bold rectangle. Furthermore, outputs of a first order detector associated with nodes (i−k−j, 1) where (j=1, . . . , k) are the corrected feedback signals 35 delivered by EDAC module 15 to ESG module 13.

The time-detectors diagrams may be expanded to visualize and facilitate the process of generating the modified syndromes. For a demodulator with k-error correcting capability, the time-detector diagram could be expanded by splitting each horizontal line of the diagram, except the horizontal axis, into (k+1) stripes. This splitting operation appears in each of the time-detectors diagrams in FIGS. 9, 11, 13, 15 and 17. In these diagrams, the length of a stripe at an arbitrary node stands for the length of time slots used in yielding the output signal described by the node. Accordingly, the length of a strip associated with a horizontal line representing an arbitrary differential detector of order m is equal to m bits.

Upon building the time-detector diagram, the modified syndromes for a demodulator with a k-error correcting capability may be obtained as follows:

(i) The modified syndromes in case of a (k−1) error correcting capability are delayed by one bit. As shown in FIG. 8, this accounts for all detectors except the (k+1)th order detector, and for all sampling times except for the sampling time $t_i$. In other words, the one-bit delay accounts for all nodes within the time-detectors diagram except for the nodes spanned by the large arrows of FIG. 8, e.g., (i−k, k+1), . . . (i, k+1), . . . (i, 2).

(ii) The syndrome associated with the $(k+1)^{th}$ detectors are generated starting from node (i−k, k+1) and moving toward node (i, k+1) as shown by the large horizontal arrow. Those syndromes are generated using the outputs of the $(k+1)^{th}$ detector as a parity check for mixed outputs of other lower-order differential detectors ranging from the $k^{th}$ order detector to the first order detector.

(iii) The syndromes associated with the sampling time $t_i$ are generated starting form node (i, k) and moving toward node (i, 2) as shown by the large vertical arrow in FIG. 8. The syndromes are generated using outputs of lower order differential detectors not considered in steps (i) and (ii).

(iv) Syndromes generated in steps (ii) and (iii) are searched for syndromes not containing the erroneous bit to be corrected, $e_1(i-k)$. Those syndromes are added through an EXOR gate to other syndromes of steps (i), (ii), or (iii) to eliminate repeated erroneous bit. This step completes the process of generating the modified syndromes.

Upon generating the modified syndromes, ESG module 13 may then exploit them in generating 2k error signals. In generating these error signals, if an uncorrected error except $e_1(i-k)$ appears in several syndromes, those syndromes may be combined through an AND gate (not shown). An AND gate outputs 1 if all its inputs are 1's, and outputs 0 otherwise. Syndromes not having repeated errors are not changed and may be used as error signals.

The number 2k of generated errors signals is equal to the number of unknowns to be determined: k unknowns representing locations of the unknown errors, and other k unknowns representing values of those unknown errors. Mathematically, the number 2k error signals is sufficient to achieve the required k-error correcting capability. It stands for 2k independent equations (error signals) that can be solved for the unknown errors. Any additional equation (error signal) is redundant and it leads to a dependent set of equations that may not have a solution.

Error Detection and Correction (EDAC) Module

After generating the error signals 47, ESG module 13 may deliver them to EDAC module 15, as indicated in the block diagram of FIG. 6. In EDAC module 15, error signals 47 may be used to generate a correction factor $ec_1(i-k)$ for correcting erroneous bits of the form $e_1(i-k)$, according to the following equation:

$$e_1'(i-k)=ec_1(i-k)\oplus e_1(i-k) \tag{8}$$

In obtaining the correction factor $ec_1(i-k)$, EDAC module 15 may sum error signals algebraically. If the sum is greater than a threshold value of k (as shown in the table of FIG. 5), the correction factor $ec_1(i-k)$ may be set to 1. Otherwise the correction factor $ec_1(i-k)$ may be set to 0. This corrects $e_1(i-k)$ in the presence of up to (k-1) additional errors.

With reference again to FIG. 6, after a demodulator or demodulating algorithm according to the invention generates the corrected bit $e_1'(i-k)$ as output 45 from EXOR 39, delay module 37 delays the bit successively by k bits yielding the following signals: $e_1'(i-k-1)$, $e_1'(i-k-2)$, ... $e_1'(i-2k+1)$, $e_1'(i-2k)$. These signals are delayed feedback corrected signals 35, which are delivered back to ESG module 13 to be used in forming a new set of modified syndromes and hence a new set of error signals to be used in correcting the next erroneous bit, and so on.

Modified Syndromes

It is instructive to establish the mathematical identity governing the phase difference $\Delta_m(i)$ used by an arbitrary differential detector with an order m at the sampling time $t_i$:

$$\Delta_m(i) = \alpha \sum_{j=0}^{m} a_{i-j} \tag{9}$$

In equation (9), $\alpha$ is a constant phase with a value depending on the modulation structure. In case of DMSK and SBPSK the value of $\alpha$ is $\pi/2$, and in case of CBPSK the value of $\alpha$ is $\pi$. As for $\alpha_i$'s, they represent the binary modulated data. Introducing eq. (9) into either eq. (5) or eq. (6) yields the response $D_m(i)$ of the m order differential detector:

$$D_m(i) = \left(\sum_{j=0}^{m} a_{i-j}\right) modulo 2 \tag{10}$$

For a modulo-2, summation is equivalent to subtraction, therefore both can be achieved through operation of EXOR gate. With this in mind and with some algebraic manipulations, eq. (10) can be reduced to:

$$D_m(i)=D_{m1}(i)\oplus D_{m2}(i-m1) \tag{11}$$

where $0 \leq m_1 \leq m$ and $m_2=m-m_1$.

In the presence of errors, eq. (11) may be written as:

$$\tilde{D}_m(i)=D_m(i)\oplus e_m(i) \tag{12}$$

In eq. (12), $e_m(i)$ is introduced to account for the error in the outputs of the $m^{th}$ detector at the sampling time $t_i$. The value $e_m(i)$ may be set to 1 if an error exists, and may be set to 0 if an error does not exist. Expressions similar in form to eq. (12) may be written for both $\tilde{D}_{m1}(i)$ and $\tilde{D}_{m2}(i-m1)$ of eq. (11).

A modified syndrome may now be defined as:

$$X=\tilde{D}_m(i)\oplus \tilde{D}_{m1}(i)\oplus \tilde{D}_{m2}(i-m1) \tag{13}$$

Introducing eq. (12) and its counterparts for $\tilde{D}_{m1}(i)$ and $\tilde{D}_{m2}(i-m1)$ into eq. (13) and using eq. (11) reduces the modified syndrome formulation into:

$$X=e_m(i)\oplus e_{m1}(i)\oplus e_{m2}(i-m1) \tag{14}$$

Either value of $m_1$ or $m_2$ in eq. (14) may be downsized until it reaches a value of 1. So doing reduces eq. (14) into the classical syndrome representation relating the error of a higher-order differential detector, and the error of the first order differential detector:

$$X=e_m(i)\oplus e_1(i)\oplus \ldots \oplus e_1(i-m+1) \tag{15}$$

In a binary differential demodulator according to the invention, either eq. (14) or eq. (15) may be used in constructing the modified syndromes depending on the node within the time-detectors diagram of FIG. 8 at which the modified syndrome is generated.

Design of a Single-Error Correcting Binary Demodulator

The design of a single-error correcting demodulator is considered here because it is the starting point from which the design of multi-error correcting demodulators evolves. A demodulator with a single error capability uses outputs of two differential detectors: (1) a first order (conventional) differential detector; and (2) a second order (two bits) differential detector.

FIG. 9 shows an expanded time-detectors diagram for a single-error correcting demodulator according to the invention. Note that in this diagram, there are only two nodes where the syndromes could be obtained, i.e. at node (i-1, 2) and at node (i, 2).

Applying eq. (15) at those nodes yields the following two modified syndromes:

$$X_1=e_2(i-1)\oplus e_1'(i-2)\oplus e_1(i-1)$$

$$X_2=e_2(i)\oplus e_1(i-1)\oplus e_1(i) \tag{16}$$

Since each error, except $e_1(i-1)$, appears only once in eq. (16), the error signals for correcting $e_1(i-1)$ can be written from eq. (16) as:

$$Z_1=X_1$$

$$Z_2=X_2 \tag{17}$$

The error signals in eq. (17) are used in building the table of FIG. 10, which gives the number of error signals having a zero value and also the algebraic sum of the error signals when either $e_1(i-1)$ has a value of 1, or another error signal in addition to $e_1(i-1)$ has a value of 1.

Based on FIG. 10, in correcting for $e_1(i-1)$ in the absence of other errors, the correction factor $ec_1(i-1)$ may be set to a value of 1 if:

$$S_1 = Z_1 + Z_2 > 1 \tag{18}$$

Otherwise $ec_1(i-1)$ is set to a value of zero. This justifies the threshold reported in the table of FIG. 5 for single-error correcting demodulators. It is also worth noting that the threshold value given in eq. (18) is equivalent to the AND gate used in conventional non-redundant single-error correcting demodulators.

Design of a Double-Error Correcting Binary Demodulator

One embodiment of a double-error correcting demodulator according to the invention may use the outputs of the following three differential detectors: (i) a first order (conventional) differential detector; (ii) a second order differential detector; and (iii) a third order differential detector.

FIG. 11 shows an expanded time-detectors diagram describing the outputs of the three differential detectors of the double-error correcting demodulator. This diagram encompasses the time-detectors diagram of a single-error correcting demodulator, and also encompasses three nodes associated with the third order differential detector, e.g. the nodes (i−2, 3), (i−1, 3) and (i, 3), as well as one node associated with the second order differential detector at the instant i(i, 2). Using FIG. 11, and following the procedures given above for operation of ESG module 13, the modified syndromes for the double-error correcting demodulator may be given as follows:

$$X_1 = e_2(i-2) \oplus e_1'(i-3) \oplus e_1(i-2)$$

$$X_2 = e_2(i-1) \oplus e_1(i-2) \oplus e_1(i-1)$$

$$X_3 = e_3(i-2) \oplus e_1'(i-4) \oplus e_1'(i-3) \oplus e_1(i-2)$$

$$X_4 = e_3(i-1) \oplus e_2(i) \oplus e_1'(i-3) \oplus e_1'(i-2) \oplus e_1(i)$$

$$X_5 = e_3(i) \oplus e_2(i) \oplus e_1(i-2) \tag{19}$$

In the above, $X_1$ and $X_2$ arise from delaying the modified syndromes of a single-error correcting demodulator as in eq. (17) by one bit. Values for $X_3$ and $X_5$ may be obtained through applying eq. (15) at the nodes (i−2, 3) and (i−3). A value for $X_4$ may be obtained by combining the syndromes obtained at the nodes (i−1, 3) and (i, 2) through an EXOR gate.

The error signals based on the modified syndromes of eq. (19) may be given by:

$$Z_1 = X_1$$

$$Z_2 = X_2$$

$$Z_3 = X_3$$

$$Z_4 = X_4 \cdot X_5 \tag{20}$$

The AND gate, indicated by the dot symbol, is used above in formulating $Z_4$ to ensure that $e_2(i)$ appears only once among all error signals in eq. (20). The error signals in eq. (20) have the following two novel characteristics that simplify the error detection process:

(i) all error signals are orthogonal to $e_1(i-2)$, and (ii) each one of all other errors appears only once in eq. (20).

Exploiting these novel characteristics gives the number of error signals having zero values, and the algebraic sum of error signals in eq. 20. These results are listed in the table of FIG. 12, which is generated in the presence of either one of the following conditions:

(i) only $e_1(i-2)$ has a value of 1, and (ii) each of $e_1(i-2)$ and one additional error have a value of 1.

Based on the table of FIG. 12, in correcting for $e_1(i-2)$ in the presence of up to an additional single error, the correction factor $ec_1(i-2)$ may be set to a value of 1 if the following condition holds:

$$S_2 = Z_1 + Z_2 + Z_3 + Z_4 > 2 \tag{21}$$

Otherwise, $ec_1(i-2)$ may be set to zero. This justifies the threshold reported in the table of FIG. 5 for demodulators having double-error correcting capability. Such a threshold may also account for a triple-error correcting capability when $Z_4 = 0$, and both $X_4$ and $X_5$ are 0. In such a case there is a possibility of the presence of two additional errors beside $e_1(i-2)$.

Design of a Triple-Error Correcting Binary Demodulator

A demodulator according to the invention having a triple-error correcting capability may use the outputs of four differential detectors: (i) a first order (conventional) differential detector; (ii) a second order differential detector; (iii) a third order differential detector, and (iv) a fourth order differential detector.

Figure 13:
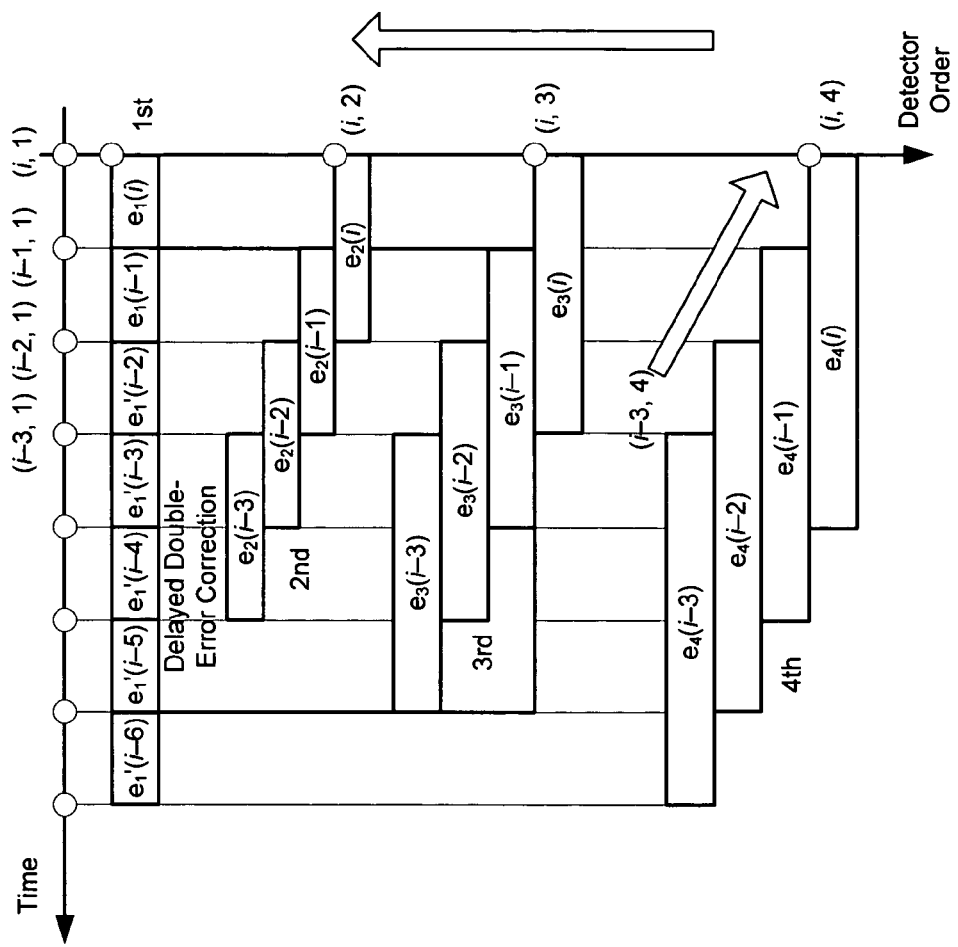
FIG. 13 shows an expanded time-detectors diagram for a triple-error correcting binary demodulator according to the invention.

FIG. 13 shows the time-detectors diagram relating outputs of these four differential detectors. The diagram encompasses the time-detectors diagram for a double-error correcting demodulator, and hence the time-detectors diagram for a single-error correction demodulator.

The equations describing the modified syndromes of a triple-error correcting demodulator may be given by:

$$X_1 = e_2(i-3) \oplus e_1'(i-4) \oplus e_1(i-3)$$

$$X_2 = e_2(i-2) \oplus e_1(i-3) \oplus e_1(i-2)$$

$$X_3 = e_3(i-3) \oplus e_1'(i-5) \oplus e_1'(i-4) \oplus e_1(i-3)$$

$$X_4 = e_3(i-2) \oplus e_2(i-1) \oplus e_1'(i-4) \oplus e_1'(i-3) \oplus e_1(i-1)$$

$$X_5 = e_3(i-1) \oplus e_2(i-1) \oplus e_1(i-3)$$

$$X_6 = e_4(i-3) \oplus e_1'(i-6) \oplus e_1'(i-5) \oplus e_1'(i-4) \oplus e_1(i-3)$$

$$X_7 = e_4(i-2) \oplus e_1'(i-5) \oplus e_1'(i-4) \oplus e_1(i-3) \oplus e_1(i-2)$$

$$X_8 = e_4(i-1) \oplus e_2(i) \oplus e_1'(i-4) \oplus e_1(i-3) \oplus e_1(i-2) \oplus e_1(i)$$

$$X_9 = e_4(i) \oplus e_3(i) \oplus e_1(i-3) \tag{22}$$

Equations (22) are obtained using FIG. 13 and following the procedures given above for operation of ESG module 13. For instance, $X_1$, $X_2$, $X_3$, and $X_5$ may be obtained through delaying their counterparts given in eq. (19) for the double-error correcting demodulator by one bit. Values for $X_6$ and $X_7$ may be obtained by applying eq. (15) at the nodes (i−3, 4) and (i−2, 4). A value for $X_9$ may be obtained by applying (14) at the node (i, 4). As for $X_8$, it may be obtained through combining the syndromes obtained at the nodes (i−1, 4) and (i, 2) through an EXOR gate.

The error signals based on eq. (22) may be given by:

$$Z_1 = X_1$$

$$Z_2 = X_3$$

$$Z_3 = X_6$$

$$Z_4 = X_9$$

$Z_5 = X_4 \cdot X_5$ $Z_6 = X_2 \cdot X_7 \cdot X_8$ (23)

The AND gate (indicated by the dot symbol) used in $Z_5$ of eq. (23) ensures that $e_2(i-1)$ appears only once in the error signals of eq. (23). The AND gates in $Z_6$ ensure that $e_1(i-2)$ appears only once in the error signals of eq. (23).

The error signals of eq. (23) have similar characteristics to those of eq. (20) except with respect to $e_1(i-3)$. Exploiting those characteristics yields the table of FIG. 14, which gives the number of error signals having zero values, and the algebraic sum of error signals in the presence of either one of the following conditions:

(i) only $e_1(i-3)$ has a value of 1,
(ii) each of $e_1(i-3)$ and one additional error have a value of 1, and
(iii) each of $e_1(i-3)$ and two additional errors have a value of 1.

Based on FIG. 14, in correcting for $e_1(i-3)$ in the presence of up to two additional errors, $ec_1(i-3)$ may be set to a value of 1, if the following condition holds:

$$S3 = \sum_{i=1}^{6} Z_i > 3 \quad (24)$$

Otherwise $ec_1(i-3)$ may be set to zero. This justifies the threshold reported in the table of FIG. 5 for the triple-error correcting demodulators. Also, such a threshold may be capable of accounting for some quadruple and quintuple error correcting capabilities because of the AND gates used in constructing $Z_5$ and $Z_6$ of eq. (23). This can be justified using a concept similar to that used above for the double-error correcting binary demodulator to justify the triple-error correcting capability that may be achieved by double-error correcting demodulators.

Design of a Quadruple Error Correcting Binary Demodulator

The design of a quadruple error correcting demodulator according to the invention may use the outputs of five differential detectors: (i) a first order (conventional) differential detector; (ii) a second order differential detector; (iii) a third order differential detector; (iv) a fourth order differential detector; and (v) a fifth order differential detector.

Figure 15:
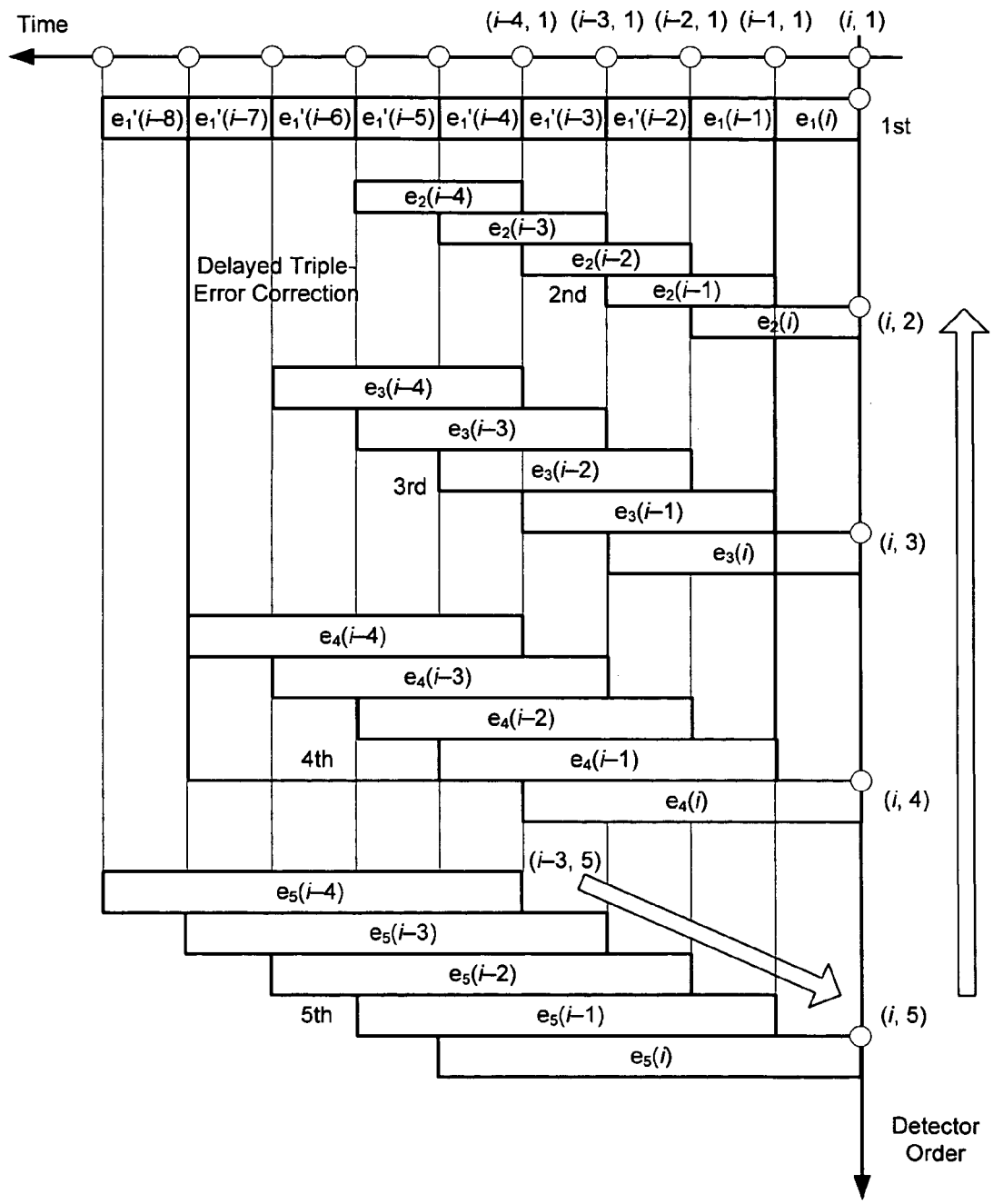
FIG. 15 shows an expanded time-detectors diagram for a quadruple-error correcting binary demodulator according to the invention.
Figure 17:
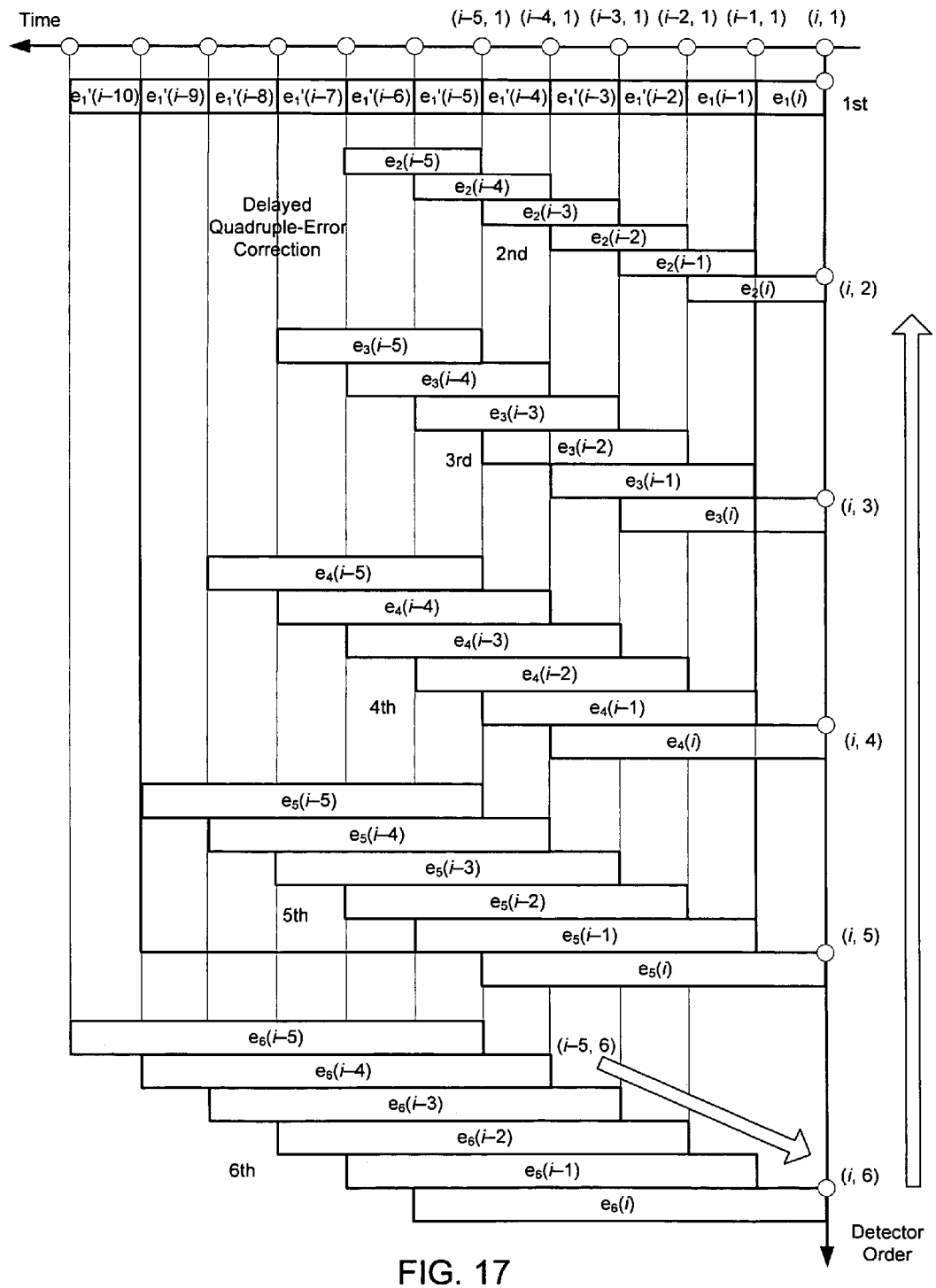
FIG. 17 shows an expanded time-detectors diagram for a quintuple-error correcting binary demodulator according to the invention.

FIG. 15 shows the time-detector diagram relating outputs of these five differential detectors. The diagram encompasses the time-detectors diagram for a triple-error correcting demodulator, and hence the time-detectors diagrams for both a double-error and a single-error correcting demodulator.

The modified syndromes for a quadruple-error correcting demodulator may be given by:

$X_1 = e_2(i-4) \oplus e_1'(i-5) \oplus e_1(i-4)$ $X_2 = e_2(i-3) \oplus e_1(i-3) \oplus e_1(i-4)$ $X_3 = e_3(i-4) \oplus e_1'(i-6) \oplus e_1'(i-5) \oplus e_1(i-4)$ $X_4 = e_3(i-3) \oplus e_2(i-2) \oplus e_1'(i-5) \oplus e_1(i-4) \oplus e_1(i-2)$ $X_5 = e_3(i-2) \oplus e_2(i-2) \oplus e_1(i-4)$ $X_6 = e_4(i-4) \oplus e^{1'}(i-7) \oplus e_1'(i-6) \oplus e_1(i-5) \oplus e_1(i-4)$ $X_7 = e_4(i-3) \oplus e_1'(i-6) \oplus e_1'(i-5) e_1(i-4) \oplus e_1(i-3)$ $X_8 = e_4(i-2) \oplus e_2(i-1) \oplus e_2(i) \oplus e_1'(i-5) \oplus e_1(i-4) \oplus e_1(i-3) \oplus e_1(i)$ $X_9 = e_4(i-1) \oplus e_3(i-1) \oplus e_1(i-4)$ $X_{10} = e_5(i-4) \oplus e_1(i-8) \oplus e_1'(i-7) \oplus e_1'(i-6) \oplus e_1'(i-5) \oplus e_1(i-4)$ $X_{11} = e_5(i-3) \oplus e_1'(i-7) \oplus e_1'(i-6) \oplus e_1(i-5) \oplus e_1(i-4) \oplus e_1(i-3)$ $X_{12} = e_5(i-2) \oplus e_3(i) \oplus e_1'(i-6) \oplus e_1'(i-5) \oplus e_1(i-4) \oplus e_1(i-3) \oplus e_1(i-1) \oplus e_1(i)$ $X_{13} = e_5(i-1) \oplus e_3(i-1) \oplus e_1'(i-5) \oplus e_1(i-4)$ $X_{14} = e_5(i) \oplus e_4(i) \oplus e_1(i-4)$ (25)

The error signals associated with the above modified syndromes may be given by:

$Z_1 = X_1$ $Z_2 = X_3$ $Z_3 = X_6$ $Z_4 = X_4 \cdot X_5$ $Z_5 = X_9 \cdot X_{13}$ $Z_6 = X_2 \cdot X_7 \cdot X_{11} \cdot X_8 \cdot X_{12}$ $Z_7 = X_{10}$ $Z_8 = X_{14}$ (26)

The error signals of eq. (26) have characteristics similar to those of either eq. (20) or eq. (23), except with respect to $e_1(i-4)$. Exploiting those characteristics yields the table of FIG. 16, which gives the number of error signals having zero values, and the algebraic sum of error signals in the presence of either one of following conditions:

(i) only $e_1(i-4)$ has a value of 1,
(ii) each of $e_1(i-4)$ and one additional error have a value of 1,
(iii) each of $e_1(i-4)$ and two additional errors have a value of 1,
(iv) each of $e_1(i-4)$ and three additional errors have a value of 1.

Based on the table of FIG. 16, in correcting for $e_1(i-4)$ in the presence of up to three additional errors, the correction factor $ec_1(i-4)$ may be set equal to a value of 1 under the following condition:

$$S_4 = \sum_{i=1}^{8} Z_i > 4 \quad (27)$$

Otherwise $ec_1(i-4)$ may be set to zero. This justifies the threshold reported in the table of FIG. 5 for quadruple-error correcting demodulators. Such a threshold also may account for higher-order error correcting capabilities due to the AND gates used in constructing $Z_4$, $Z_5$ and $Z_6$ of eq. (26).

Design of a Quintuple-Error Correcting Binary Demodulator

A quintuple-error correcting demodulator according to the invention may use the output of six differential detectors: (i) a first order (conventional) differential detector; (ii) a second order differential detector; (iii) a third order differential detector; (iv) a fourth order differential detector; (v) a fifth order differential detector; and (vi) a sixth order differential detector.

The modified syndrome equations for a quintuple-error correcting demodulator may be given by:

$$X_1 = e_2(i-5) \oplus e_1'(i-6) \oplus e_1(i-5)$$

$$X_2 = e_2(i-4) \oplus e_1(i-5) \oplus e_1(i-4)$$

$$X_3 = e_3(i-5) \oplus e_1(i-7) \oplus e_1'(i-6) \oplus e_1(i-5)$$

$$X_4 = e_3(i-4) \oplus e_2(i-3) \oplus e_1'(i-6) \oplus e_1(i-5) \oplus e_1(i-3)$$

$$X_5 = e_3(i-3) \oplus e_2(i-3) \oplus e_1(i-5)$$

$$X_6 = e_4(i-5) \oplus e^{1'}(i-8) \oplus e_1'(i-7) \oplus e_1'(i-6) \oplus e_1(i-5)$$

$$X_7 = e_4(i-4) \oplus e_1'(i-7) \oplus e_1'(i-6) \oplus e_1(i-5) \oplus e_1(i-4)$$

$$X_8 = e_4(i-3) \oplus e_2(i-2) \oplus e_2(i-1) \oplus e_1'(i-6) \oplus e_1(i-5) \oplus e_1(i-4) \oplus e_1(i-1)$$

$$X_9 = e_4(i-2) \oplus e_3(i-2) \oplus e_1(i-5)$$

$$X_{10} = e_5(i-5) \oplus e_1'(i-9) \oplus e_1'(i-8) \oplus e_1'(i-7) \oplus e_1'(i-6) \oplus e_1(i-5)$$

$$X_{11} = e_5(i-4) \oplus e_1'(i-8) \oplus e_1'(i-7) \oplus e_1'(i-6) \oplus e_1(i-5) \oplus e_1(i-4)$$

$$X_{12} = e_5(i-3) \oplus e_3(i) \oplus e_3(i-1) \oplus e_1'(i-7) \oplus e_1'(i-6) \oplus e_1(i-5) \oplus e_1(i-4) \oplus e_1(i)$$

$$X_{13} = e_5(i-2) \oplus e_3(i-2) \oplus e^{1'}(i-6) \oplus e_1(i-5)$$

$$X_{14} = e_5(i-1) \oplus e_4(i-1) \oplus e_1(i-5)$$

$$X_{15} = e_6(i-5) \oplus e_1(i-10) \oplus e_1(i-9) \oplus e_1'(i-8) \oplus e_1'(i-7) \oplus e_1'(i-6) \oplus e_1(i-5)$$

$$X_{16} = e_6(i-4) \oplus e_1(i-9) \oplus e_1'(i-8) \oplus e_1(i-7) \oplus e_1'(i-6) \oplus e_1(i-5) \oplus e_1(i-4)$$

$$X_{17} = e_6(i-3) \oplus e_2(i-3) \oplus e_1'(i-8) \oplus e_1'(i-7) \oplus e_1'(i-6) \oplus e_1(i-5)$$

$$X_{18} = e_6(i-2) \oplus e_2(i-3) \oplus e_1'(i-7) \oplus e_1'(i-6) \oplus e_1(i-5) \oplus e_1(i-2)$$

$$X_{19} = e_6(i-1) \oplus e_4(i) \oplus e_2(i) \oplus e_1'(i-6) \oplus e_1(i-5) \oplus e_1(i-4) \oplus e_1(i-1)$$

$$X_{20} = e_6(i) \oplus e_5(i) \oplus e_1(i-5) \quad (28)$$

The modified syndromes of eq. (28) are based on the time-detectors diagram shown in FIG. 17. The error signals associated with those modified syndromes may be given by:

$$Z_1 = X_1$$

$$Z_2 = X_3$$

$$Z_3 = X_6$$

$$Z_4 = X_4 \cdot X_5 \cdot X_{17} \cdot X_{18}$$

$$Z_5 = X_9 \cdot X_{13}$$

$$Z_6 = X_2 \cdot X_7 \cdot X_{11} \cdot X_{16} \cdot X_8 \cdot X_{19}$$

$$Z_7 = X_{10}$$

$$Z_8 = X_{14}$$

$$Z_9 = X_{15}$$

$$Z_{10} = X_{20}$$

The error signals of eq. (29) have characteristics similar to those of eqs. (20), (23), and (26), except with respect to $e_1(i-5)$. Exploiting those characteristics yields the table of FIG. 18, which gives the number of error signals having zero values, and the algebraic sum of error signals in the presence of either one of the following conditions:

(i) only $e_1(i-5)$ has a value of 1,
(ii) each of $e_1(i-5)$ and one additional error have a value of 1,
(iii) each of $e_1(i-5)$ and two additional errors have a value of 1,
(iv) each of $e_1(i-5)$ and three additional errors have a value of 1,
(v) each of $e_1(i-5)$ and four additional errors have a value of 1.

Based on the table of FIG. 18, in correcting for $e_1(i-5)$ in the presence of up to four additional errors, $ec_1(i-5)$ may be set equal to a value of 1 if the following condition holds:

$$S_5 = \sum_{i=1}^{10} Z_i > 5 \quad (30)$$

Otherwise $ec_1(i-5)$ may be set to zero. This justifies the threshold value reported in the table of FIG. 5 for quintuple error correcting demodulators.

Algorithm Evaluation

Figure 19:
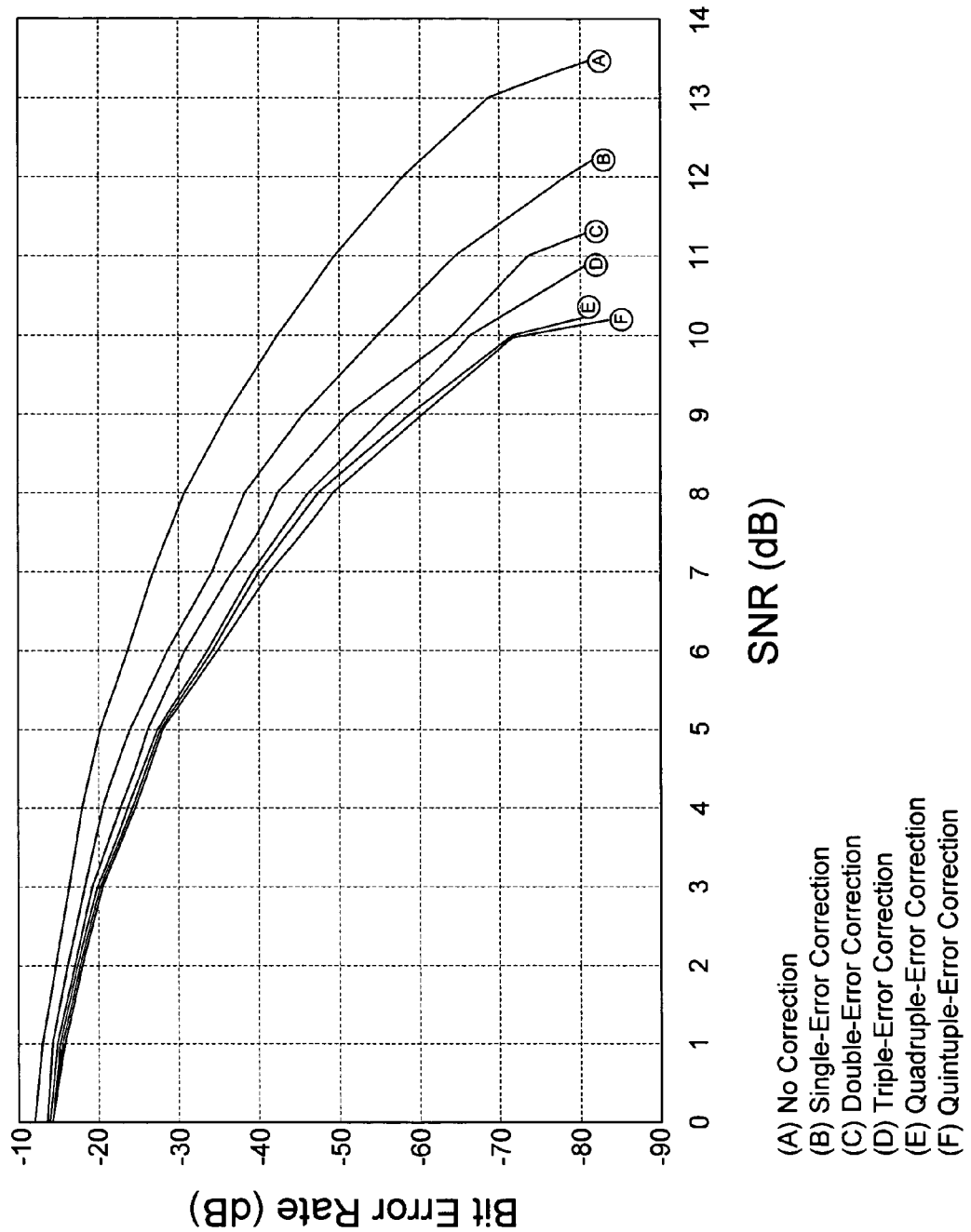
FIG. 19 is a graph showing bit error rates (BERs) as a function of signal-to-noise (SNR) ratio for demodulators having DMSK structures.
Figure 20:
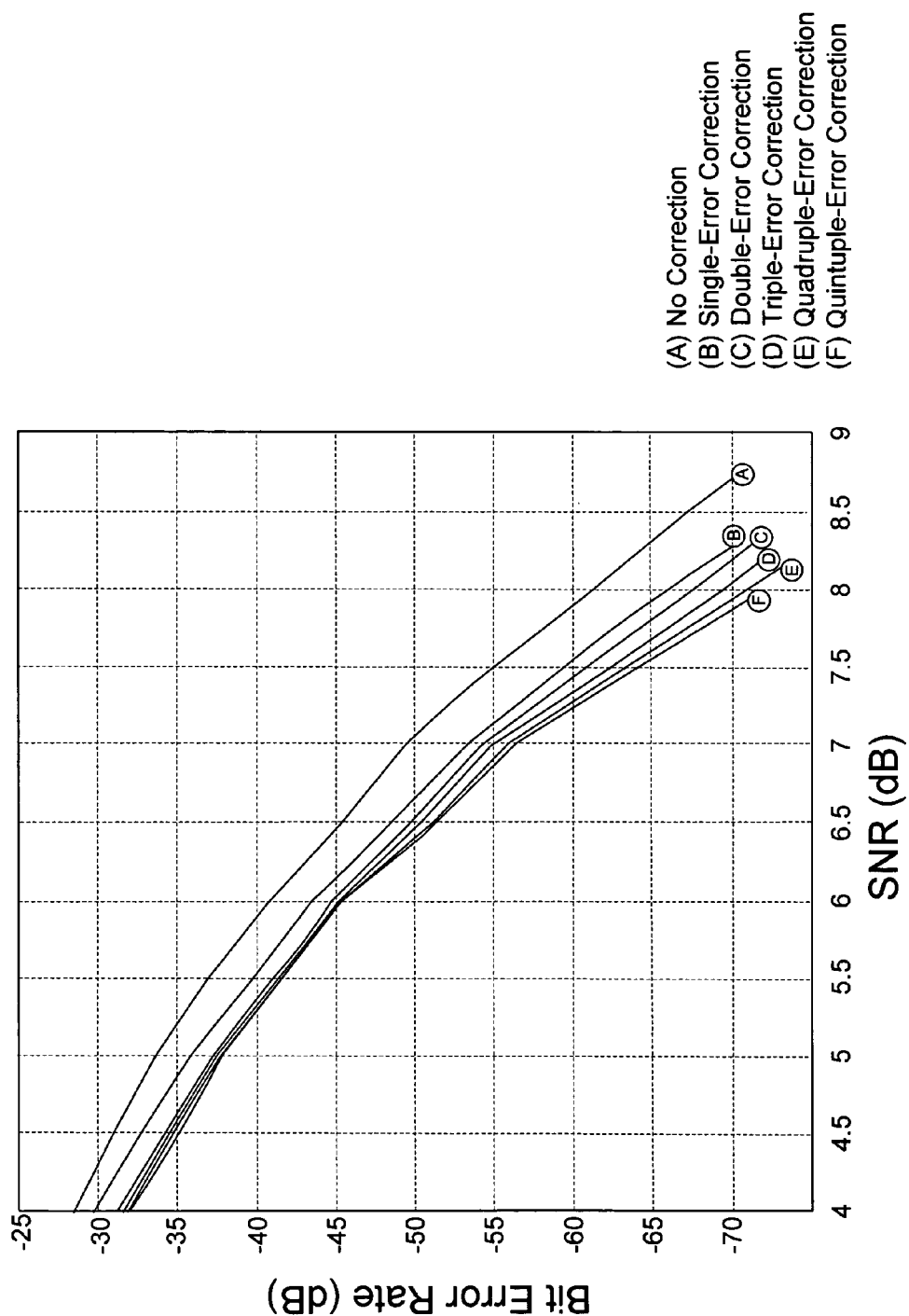
FIG. 20 is a graph showing bit error rates (BERs) as a function of signal-to-noise (SNR) ratio for demodulators having SBPSK structures.

FIGS. 19 and 20 illustrate the performance of a demodulating algorithm according to the invention. The figures depict bit error rates (BER) associated with applying error-correcting binary demodulators of various orders designed in accordance with the foregoing disclosure. FIG. 19 gives BER as a function of signal-to-noise ratio (SNR) for the demodulators recovering differential minimum shift keying (DMSK) modulated signals. FIG. 20 gives BER as a function of signal-to-noise ratio (SNR) for the demodulators recovering symmetric binary phase shift keying (SBPSK) modulated signals. Either FIG. 19 or FIG. 20 may be obtained through modulating 70000 simulated data bits by either DMSK or SBPSK modulation techniques and subjecting the modulated data to an additive white Gaussian noise (AWGN). The noisy modulated data may then be delivered as an input for the demodulator under consideration. The outputs of the demodulator may then be compared against the corresponding non-modulated simulated input data to calculate BER.

FIGS. 19 and 20 indicate that an increasing order of error-correcting capability may increase SNR improvement up to a certain order. Such an order gives maximum SNR improvement that may be gained through applying non-redundant error correcting demodulators of the present invention. It is also evident from the graphs that such improvement depends on the type of modulated signals and on the BER values. For example, at a BER value of 70 dB in the case of DMSK modulation, a single-error correcting demodulator gives a SNR improvement of 1.6 dB over the conventional (without correction) DMSK demodulator. The double-error correcting demodulator adds an additional improvement of 0.6 dB over the single-error correcting demodulator. The SNR improvement of triple-error correction over its counterpart double error correction is 0.4 dB. A quadruple-error correction adds 0.4 dB over triple-error correction, and a quintuple-error correction adds no SNR improvement over quadruple-error correction.

Note that in FIGS. 19 and 20, BER vs. SNR for the various orders of error-correction is calculated in the absence of band limiting filters and hence in the absence of intersymbol interference (ISI). Accounting for the effect of band limiting filters, and hence for ISI, may affect trends and values of BER. In addition, BER vs. SNR in FIG. 20 is calculated through demodulating SBPSK without introducing any pre-detection optimizing technique. Accounting for some of those techniques may enhance SNR improvements gained by applying demodulators with higher order-error correcting capabilities, e.g. triple-error correcting demodulators, quadruple-error correcting demodulators, and quintuple-error correcting demodulators.

The invention has been disclosed in an illustrative style. Accordingly, the terminology employed throughout should be read in an exemplary rather than a limiting manner. Although minor modifications of the present invention will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A multi-error correcting binary differential demodulator, comprising:
   a differential detectors module having a plurality of differential detectors and receiving a modulated input signal at each of (k+1) differential detectors, k being an integer greater than zero, each differential detector producing an output;
   an error signal generator module deriving, from the differential detector outputs and from feedback of corrected signals, undelayed syndromes orthogonal to an erroneous bit to be corrected, and generating a number of error signals from the syndromes; and
   an error detection-and-correction module using threshold values for generating correction factors from the algebraic sum of the error signals and combining the correction factors with the erroneous bits to produce the corrected signals.

2. The demodulator of claim 1 wherein each of the (k+1) differential detectors, in succession, mixes the modulated input signal with the modulated input signal delayed by mT, where m=1, . . . , (k+1) and T is a duration of one bit.

3. The demodulator of claim 1 wherein the output of each differential detector generates k counterparts by successive delaying of k bits, the differential detectors module thereby generating a total of $(k+1)^2$ outputs.

4. The demodulator of claim 3 wherein the error signal generator module derives the syndromes by combining the $(k+1)^2$ output signals with k corrected feedback signals.

5. The demodulator of claim 4 wherein the k corrected feedback signals are derived from a corrected erroneous bit.

6. The demodulator of claim 5 wherein the k corrected feedback signals comprise successively delayed signals.

7. The demodulator of claim 1 wherein the error signal generator module derives the syndromes using one or more outputs of a higher-order differential detector as a parity check for outputs of one or more lower-order differential detectors.

8. The demodulator of claim 1 wherein the error signal generator module generates 2k error signals from the syndromes.

9. The demodulator of claim 1 wherein the error detection-and-correction module generates the correction factors by summing the error signals algebraically, comparing the sum to a threshold value, and if the sum exceeds the threshold value, setting a correction factor to a binary one, otherwise setting the correction factor to a binary zero.

10. The demodulator of claim 9 wherein the threshold value is k.

11. An error correcting binary differential demodulator, comprising:
   a differential detectors module having a plurality of differential detectors of successively higher orders, each differential detector receiving a modulated input signal and producing an output;
   an error signal generator module deriving, from the differential detector outputs, undelayed syndromes orthogonal to an erroneous bit to be corrected, and generating a number of error signals from the syndromes, wherein the syndromes are derived using outputs of a higher-order differential detector as a parity check for outputs of all other lower-order differential detectors; and
   an error detection-and-correction module using threshold values for generating correction factors from the algebraic sum of the error signals and correcting the erroneous bit by combining the correction factors with the erroneous bits.

12. A method for correcting bit errors in a binary differential demodulator, steps of the method comprising:
   receiving a modulated input signal at each of (k+1) differential detectors;
   producing an output signal from each of the differential detectors;
   deriving, from the differential detector outputs and from feedback of corrected signals, undelayed syndromes orthogonal to an erroneous bit to be corrected;
   generating a number of error signals from the syndromes;
   using threshold values for generating correction factors from the error signals; and
   combining the correction factors with the erroneous bits to produce the corrected signals;
   where k is an integer greater than zero.

13. The method of claim 12 further comprising each of the (k+1) differential detectors successively mixing the modulated input signal with the modulated input signal delayed by mT, where m=1, . . . , (k+1) and T is a duration of one bit.

14. The method of claim 12 further comprising each differential detector generating k counterparts by successive k-bit delay, thereby generating a total of $(k+1)^2$ outputs.

15. The method of claim 14 further comprising deriving the syndromes by combining the $(k+1)^2$ output signals with k corrected feedback signals.

16. The method of claim 12 further comprising deriving the syndromes using one or more outputs of a higher-order differential detector as a parity check for outputs of one or more lower-order differential detectors.

17. The method of claim 12 wherein the first generating step comprises generating 2k error signals from the syndromes.

18. The method of claim 12 wherein the deriving step further comprises deriving the syndromes using outputs of a higher-order differential detector as a parity check for outputs of all other lower-order differential detectors.

19. The method of claim 12 wherein the first generating step comprises generating 2k error signals from the syndromes.

20. The method of claim 12 wherein the second generating step further comprises generating the correction factors by summing the error signals algebraically, comparing the sum to a threshold value, and if the sum exceeds the threshold value, setting a correction factor to a binary one, otherwise setting the correction factor to a binary zero.

* * * * *